US006944348B2

(12) United States Patent
Kajita

(10) Patent No.: US 6,944,348 B2
(45) Date of Patent: Sep. 13, 2005

(54) APPARATUS AND METHOD FOR CODING/DECODING

(75) Inventor: Kuniyuki Kajita, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/814,222

(22) Filed: Apr. 1, 2004

(65) Prior Publication Data

US 2004/0187062 A1 Sep. 23, 2004

Related U.S. Application Data

(62) Division of application No. 10/018,658, filed as application No. PCT/JP01/03380 on Apr. 20, 2001.

(30) Foreign Application Priority Data

Apr. 26, 2000 (JP) ........................................ 2000-126506

(51) Int. Cl.[7] .................................................. G06K 9/36
(52) U.S. Cl. ....................................................... 382/239
(58) Field of Search ................................. 382/232, 239, 382/252; 455/451, 452.1, 452.2; 714/746, 751, 752, 753, 754, 758, 774, 776, 778–780, 784, 785, 786, 794, 795, 798, 799, 800–804, 806

(56) References Cited

U.S. PATENT DOCUMENTS

| 4,145,683 | A | * | 3/1979 | Brookhart | 714/758 |
|---|---|---|---|---|---|
| 4,441,184 | A | * | 4/1984 | Sonoda et al. | 714/755 |
| 4,584,685 | A | * | 4/1986 | Gajjar | 714/751 |
| 4,929,946 | A | | 5/1990 | O'Brien et al. | |
| 5,509,020 | A | | 4/1996 | Iwakiri et al. | |
| 5,781,570 | A | | 7/1998 | Hattori | |
| 5,844,918 | A | * | 12/1998 | Kato | 714/751 |
| 6,061,823 | A | * | 5/2000 | Nara | 714/758 |
| 6,081,919 | A | | 6/2000 | Fujiwara et al. | |
| 6,092,231 | A | * | 7/2000 | Sze | 714/758 |
| 6,226,247 | B1 | * | 5/2001 | Sako et al. | 369/53.31 |
| 6,421,805 | B1 | * | 7/2002 | McAuliffe | 714/756 |
| 6,470,472 | B1 | * | 10/2002 | Johansson | 714/785 |
| 6,697,988 | B2 | * | 2/2004 | Kim et al. | 714/752 |
| 6,765,887 | B1 | * | 7/2004 | Shiu et al. | 370/329 |

FOREIGN PATENT DOCUMENTS

| EP | 0763902 | 3/1997 |
|---|---|---|
| EP | 0802636 | 10/1997 |
| EP | 0854581 | 7/1998 |
| EP | 1030460 | 8/2000 |
| JP | 08129830 | 5/1996 |
| JP | 08288914 | 11/1996 |
| JP | 09149080 | 6/1997 |
| KR | 1998064845 | 10/1998 |
| WO | 9910984 | 3/1999 |

OTHER PUBLICATIONS

International Search Report dated Jul. 3, 2001.

3rd Generation Partnership Project (3GPP); Technical Specification Group Radio Access Network Multiplexing and channel coding (FDD), (3G TS 25.212 version 3.1.0), Dec. 1999.

(Continued)

Primary Examiner—Jose L. Couso
(74) Attorney, Agent, or Firm—Stevens, Davis, Miller & Mosher, LLP

(57) ABSTRACT

A coding/decoding technique capable of increasing the error correcting decoding performance and improving the communication quality. This technique divides, through code block segmentation prior to error correcting coding, transmission data with CRC-bit added into a predetermined number of code blocks so that the data length of each code block is an integer multiple of the data length of each transport block and ensures that CRC-bit exists at the end of each code block. Then, the technique performs error correcting coding on each code block after the division.

11 Claims, 5 Drawing Sheets

OTHER PUBLICATIONS

Korean Office Action dated May 24, 2004 with English translation.

"3$^{rd}$ Generation Partnership Project (3GPP); Technical Specification Group Radio Access Network Multiplexing and Channel Coding (FDD) (3G TS 26.212 Version 3.0.0)," XP002149187, ppgs. 51–53, Oct. 1999.

Reed–Solomon BCH Decoder, Internet Article, XP002292119, http://www.mentor.com/inventra/cores/catalog/prod_desc/rsdec_pd.pdf, Nov. 13, 1997.

Okumura Y. et al., "Variable–Rate Data Transmission with Blind Rate Detection for Coherent DS–CDMA Mobile Radio," IEICE Transactions on Communications, Institute of Electronics Information and Comm. Eng., Tokyo, JP, vol. E81–B, No. 7, ppgs, 1365–1372, XP000790169, Jul. 1, 1998.

3 G TS 25 212 v3.2.0 (Mar. 2000), Partnership Project: Technical Specification Group Radio Access Network; Multiplexing and channel coding (FDD) (Release 1999), pp. 1–58.

* cited by examiner

APPARATUS AND METHOD FOR CODING/DECODING

This application is a division of U.S. application Ser. No. 10/018,658, filed Dec. 21, 2001, which is a 371 of PCT/JP01/03380, filed Apr. 20, 2001.

TECHNICAL FIELD

The present invention relates to an apparatus and method for coding/decoding in a digital mobile communication system.

BACKGROUND ART

As one of error correcting coding/decoding processes in a third-generation mobile communication system, "code block segmentation" is proposed in the 3GPP technical standard document "TS 25.211 Ver3.1.0".

Code block segmentation is a means for uniformly dividing data and it is the means used to send large amount of data (in case of high bit rate) when the whole data to be sent is divided into a plurality of blocks and subjected to error correcting coding one-by-one instead of subjecting the whole data to be sent to an error correcting coding (e.g., convolutional coding or turbo coding, etc.). In addition, a unit just before division of data is called "transport block", and a unit that was connected after each transport block and further being divided is called "code block".

For example, the amount of data to be sent at a particular time is 1000 pieces, the above-described code block segmentation divides the 1000 pieces into two portions of 500 and error correcting coding is performed two times, 500 pieces at a time. That is, 1000 pieces are divided into two portions that represent two code blocks, the first code block and the second code block each of 500 pieces.

When the number of data pieces is not divisible by the divisor, for example, when 1000 pieces are divided into three portions, the number of data of 1000 pieces is assumed to be 1002 which is divisible by 3 and the minimum number that exceeds 1000, and the 1002 pieces are divided into three code blocks, that is, the first codeblock (334 pieces), the second code block (334 pieces), and the third code block (334 pieces).

In this particular case, since the actual data is only 1000 pieces, the third code block will run short of the last two pieces. This problem is handled by assigning an appropriate value (e.g., "0") to the last 2 pieces.

However, since such a conventional method uniformly divides the whole data to be sent, CRC-bit added prior to code block segmentation do not necessarily exist at the end of each code block.

Here, as shown in FIG. 5, the CRC-bit is added at the end of each data group called a "transport block" by CRC coding processing which is executed prior to code block segmentation. That is, CRC-bit is added for every transport block.

For example, as shown in FIG. 5, when the amount of data to be sent is 1000 pieces and the amount of data per one transport block including CRC-bit is 200 pieces, CRC-bit is added at the end of every 200 pieces of data.

Therefore, in such a case, if the whole data to be sent is divided into two blocks, the first code block and the second code block, then the CRC-bit of each transport block are scattered in the first code block and the second code block whereas the CRC-bit does not necessarily exist at the end of each code block. That is, referring to FIG. 5, in the first code block, the CRC-bit does not exist at the end position indicated by the arrow Y1.

When the receiving side performs error correcting decoding (e.g., turbo decoding), CRC-bit is used as decision criteria, but the CRC-bit that normally exists at the end of a data group does not exist at the end of the first code block as shown above, and therefore there is a problem that the error correcting decoding performance decreases and the communication quality deteriorates.

DISCLOSURE OF THE INVENTION

It is an object of the present invention to provide a coding/decoding apparatus and a coding/decoding method that is capable of increasing the error correcting decoding performance and thereby improving the communication quality.

The inventor has come up with the present invention by discovering that the error correcting decoding performance deteriorates significantly unless CRC-bit does not exist at the end of each code block for carrying out error correcting decoding and that the above-described problem can be solved by dividing data into a plurality of code blocks in minimum units (transport block units) in which CRC-bit exists.

Furthermore, the essence of the present invention is to improve the error correcting decoding performance by dividing data through code block segmentation prior to error correcting coding so that the length of code block data is an integer multiple of the length of transport block data and thereby ensuring that the CRC-bit exists at the end of each code block.

BEST MODE FOR CARRYING OUT THE INVENTION

As described above, the essence of the present invention is to improve the performance of error correcting decoding in the reception side by dividing, on the transmission side, the transmission data through code block segmentation prior to error correcting coding so that CRC-bit always exists at the end of each code block, and by carrying out error correcting coding for every code block after the division of the transmission data.

With reference to the attached drawings, embodiments of the present invention will be explained in detail below.

(Embodiment 1)

Figure 1:
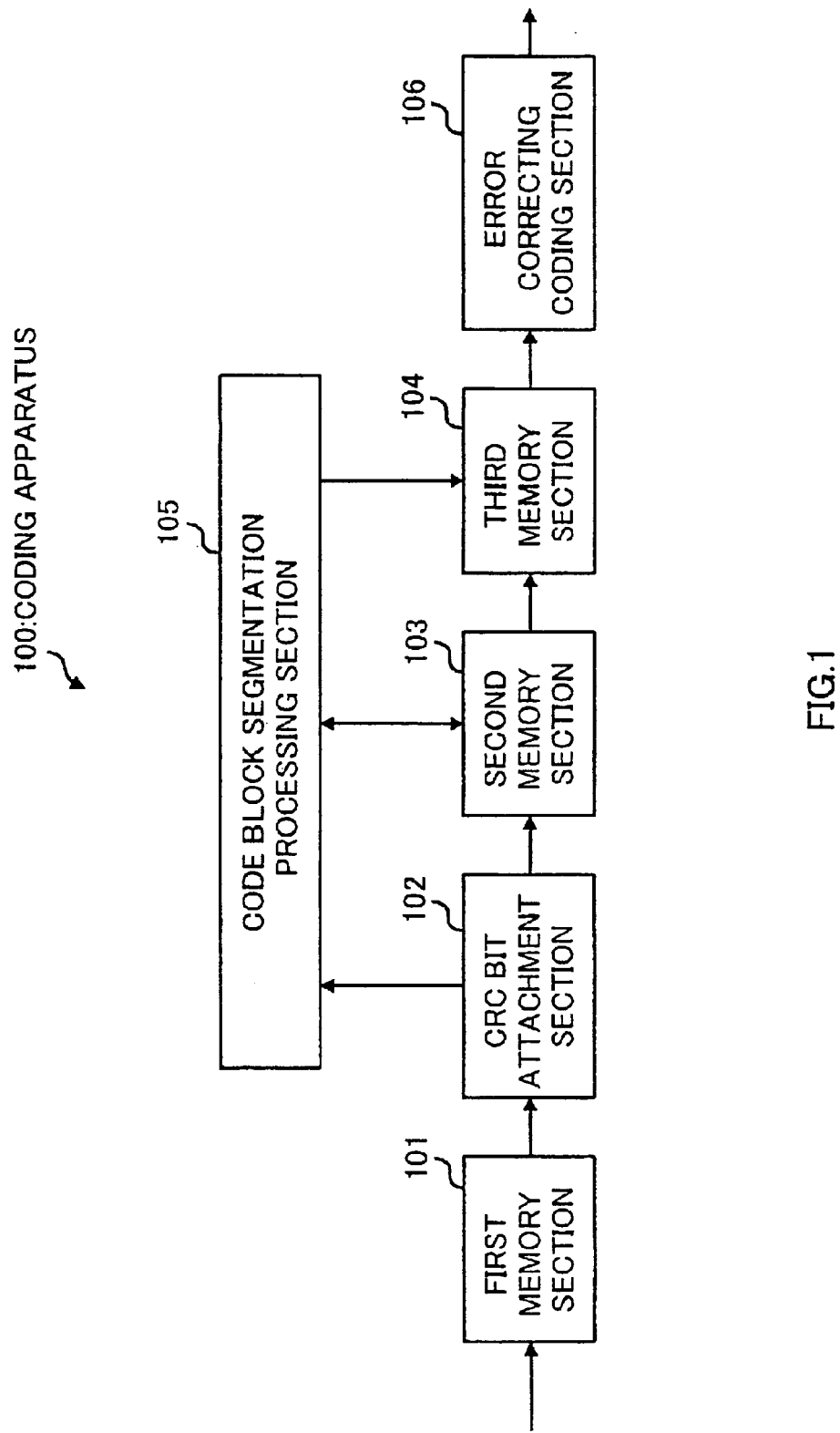
FIG. 1 is a block diagram showing a configuration of a coding apparatus according to Embodiment 1 of the present invention.

FIG. 1 is a block diagram showing a configuration of a coding apparatus according to Embodiment 1 of the present invention.

The coding apparatus 100 shown in FIG. 1 is used as a transmitting means, for instance, of a mobile station apparatus or base station apparatus, and is provided with a first memory section 101, a CRC bit attachment section 102, a second memory section 103, a third memory section 104, a code block segmentation processing section 105, and an error correcting coding section 106.

The first memory section 101 stores transmission data.

The CRC bit attachment section 102 adds CRC-bit to the data stored in the first memory section 101 by carrying out CRC coding in transport block units. The data with CRC-bit added is stored in the second memory section 103.

Figure 2:
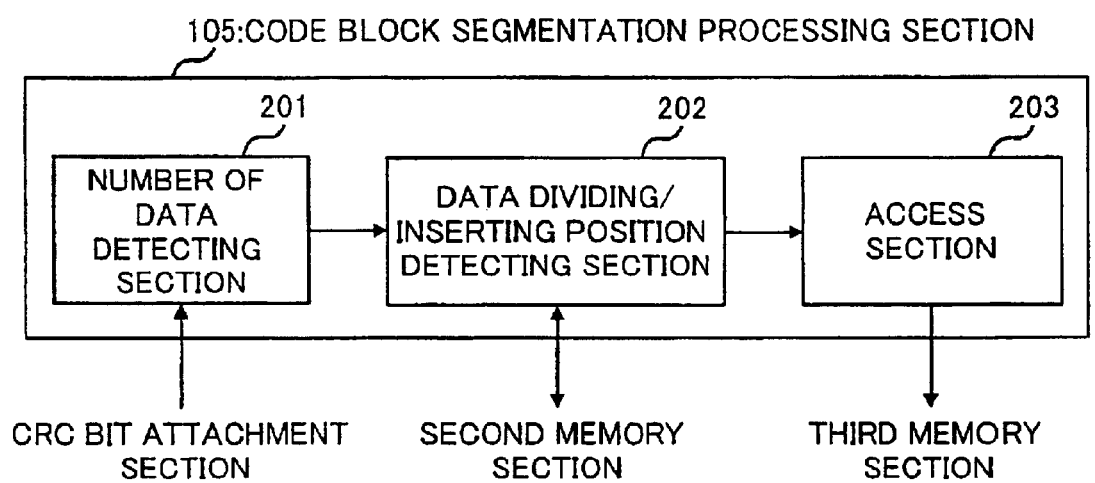
FIG. 2 is a block diagram showing a configuration of a code block segmentation processing section in the coding apparatus according to Embodiment 1.

The code block segmentation processing section 105 is the one that carries out code block segmentation processing and is provided with a number of data detecting section 201, a data dividing/inserting position detecting section 202, and an access section 203 as shown in FIG. 2.

The number of data detecting section 201 detects the number of transport blocks to which CRC-bit has been added by CRC bit attachment section 102. The number of code blocks is predetermined or notified from a higher layer or detected by a calculation method described in 3GPP TS 25.211.

The data dividing/inserting position detecting section 202 detects, based on the detection result of the number of data detecting section 201, the number of data per one code block, and divides transmitting data into a predetermined number of code blocks based on the detection result so that CRC-bit may exist at the end of each code block, that is the data length of one code block is an integer multiple of data length of one transport block. Then, when there is a code block whose number of data is smaller than other code blocks, data dividing/inserting position detecting section 202 detects the number of data to be inserted at the start position of the code block whose number of data is smaller so that the number of data of the code block becomes the same as that of other code blocks and inserts the existing data (e.g., "0") of the detected number of data at a specified position (start position) of the code block.

The access section 203 writes each code block obtained after being processed by the data dividing/inserting position detecting processing section 202 to the third memory section 104.

The error correcting coding section 106 carries out error correcting coding processing such as convolutional coding or turbo coding etc. on the data (each code block) stored in the third memory section 104.

In the following, an operation of the coding apparatus in the above-described configuration will be explained more specifically using an example. Suppose that the amount of transmission data stored in the first memory section 101 is 1000 pieces, the number of data per one transport block is 200 pieces and the number of partitions of code block segmentation processing is 2.

First, in the CRC bit attachment section 102, CRC-bit is added to the transmitting data (whose number of data is 1000 pieces) stored in the first memory section 101 by performing CRC coding per transport block (whose number of data is 200 pieces). Transport blocks with the added CRC-bit are temporarily concatenated and stored in a state of being concatenated in the second memory section 103.

In the code block segmentation processing section 105, first, the number of data detecting section 201 detects the number of transport blocks with the added CRC-bit. In this example, the number of transport blocks with the added CRC-bit is 5.

Then, the data dividing/inserting position detecting section 202 detects the number of data per one code block based on the above-described detected value so that CRC-bit exists at the end of each code block. In this example, 200 pieces of the 1000 pieces are each placed by one CRC-bit and the transmission data is divided into two code blocks, therefore the number of data of the first code block is 600 pieces (=200×3) and the number of data of the second code block is 400 pieces (=200×2). Based on this result, the transmission data is divided into two code blocks, the first code block (whose number of data is 600 pieces) and the second code block (whose number of data is 400 pieces).

In this case, the number of data of the second code block is smaller than that of the first code block, and therefore the data dividing/inserting position detecting section 202 further calculates the difference in the number of data between both blocks (200 pieces in the above-described example), regards this difference as the number of data to be inserted and inserts 200 pieces of known data (e.g., "0") at the start position of the second code block whose number of data is smaller, and updates the second code block so that the number of data of the second code block is equal to that of the first code block.

Then, the access section 203 writes the first and second code blocks to the third memory section 104. Each code block written to the third memory section 104 is subjected to error correcting coding processing such as convolutional coding or turbo coding at the error correcting coding section 106 and then transmitted. Though not shown, prior to transmission, the code blocks subjected to error correcting coding processing are concatenated, interleaved, etc.

In the above-described example, when the number of partitions of the code block segmentation processing is 3, data is divided into three code blocks of the first code block (whose number of data is 400 pieces), the second code block (whose number of data is 400 pieces) and the third code block (whose number of data is 400 pieces), and after insertion of 200 pieces of known data into the third code block, error correcting coding processing is performed on each code block. Thus, during a division prior to the insertion of known data, the transmission data is divided into a plurality of code blocks in minimum units (transport block units) in which CRC-bit exists. For example, in the above-described example, the transmission data is divided into code blocks having a data length of a multiple of 200 pieces.

Thus, the coding apparatus according to this embodiment divides the transmission data into a predetermined number of code blocks through code block segmentation prior to error correcting coding so that the data length of a code block is an integer multiple of the data length of a transport block thereby ensuring that CRC-bit exists at the end of each code block subjected to error correcting coding. Therefore, when the receiving side carries out error correcting decoding using CRC-bit as the decision condition, it is possible to carry out accurate decoding, increase the error correcting decoding performance and hence improve the communication quality.

Furthermore, in the case when there is a code block whose number of data is smaller than other code blocks, known data is inserted at the start position of the code block whose number of data is smaller so that the number of data is common to all code blocks, which can improve the effect of code block segmentation processing. Moreover, since in this case, known data is inserted, the receiving side can decode the part of the known data accurately and hence carry out error correcting decoding accurately.

When there is a difference in the data length between code blocks, this embodiment inserts known data into a code block whose number of data is smaller so that the data length is common to all code blocks, but this embodiment is not limited to this. For example, when there is no need to divide transmission data uniformly, it is possible to divide the transmission data into a plurality of code blocks but not insert known data, that is, it is possible not to carry out processing for equating number of data of all code blocks, but to store data in the third memory section 104 as a state that data length has differed, and carry out error correcting coding processing.

(Embodiment 2)

Figure 3:
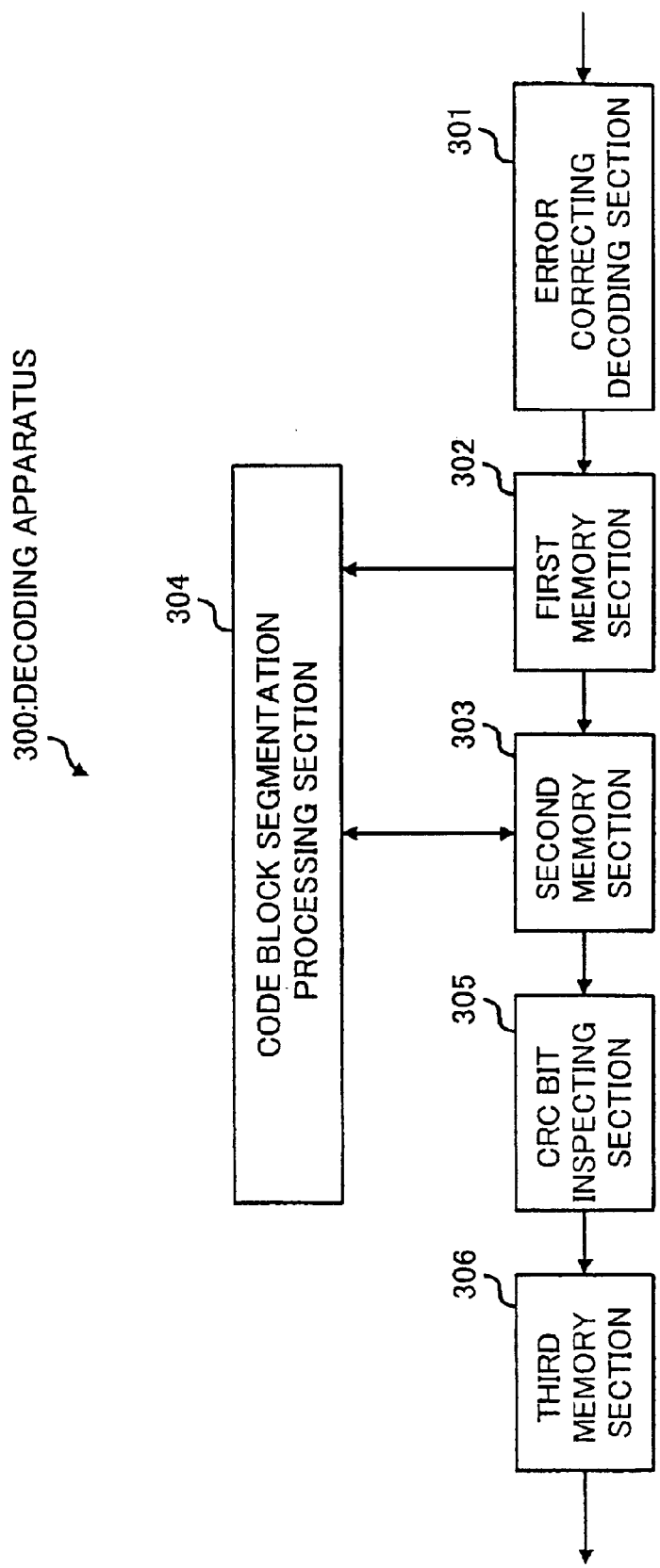
FIG. 3 is a block diagram showing a configuration of a decoding apparatus according to Embodiment 2 of the present invention.

FIG. 3 is a block diagram showing a configuration of a decoding apparatus according to Embodiment 2 of the present invention.

The decoding apparatus 300 shown in FIG. 3 is used as a receiving means of a mobile station apparatus or base station apparatus, etc., and is provided with an error correcting decoding section 301, a first memory section 302, a second memory section 303, a code block segmentation processing section 304, a CRC bit inspecting section 305, and a third memory section 306.

Figure 4:
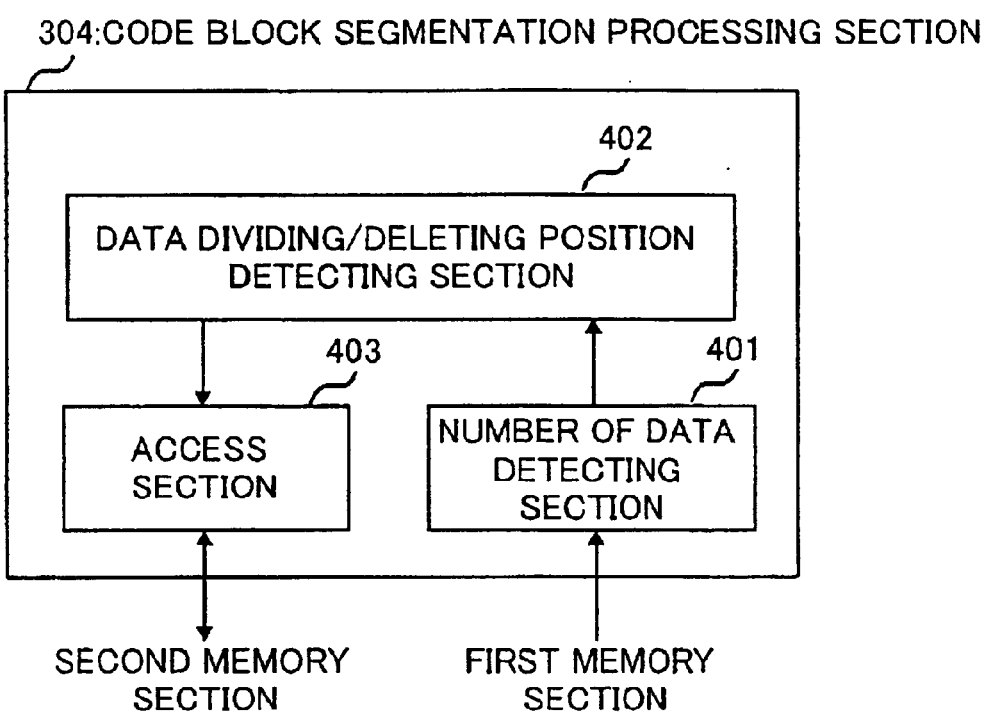
FIG. 4 is a block diagram showing a configuration of a code block segmentation processing section in the decoding apparatus according to Embodiment 2.
Figure 5:
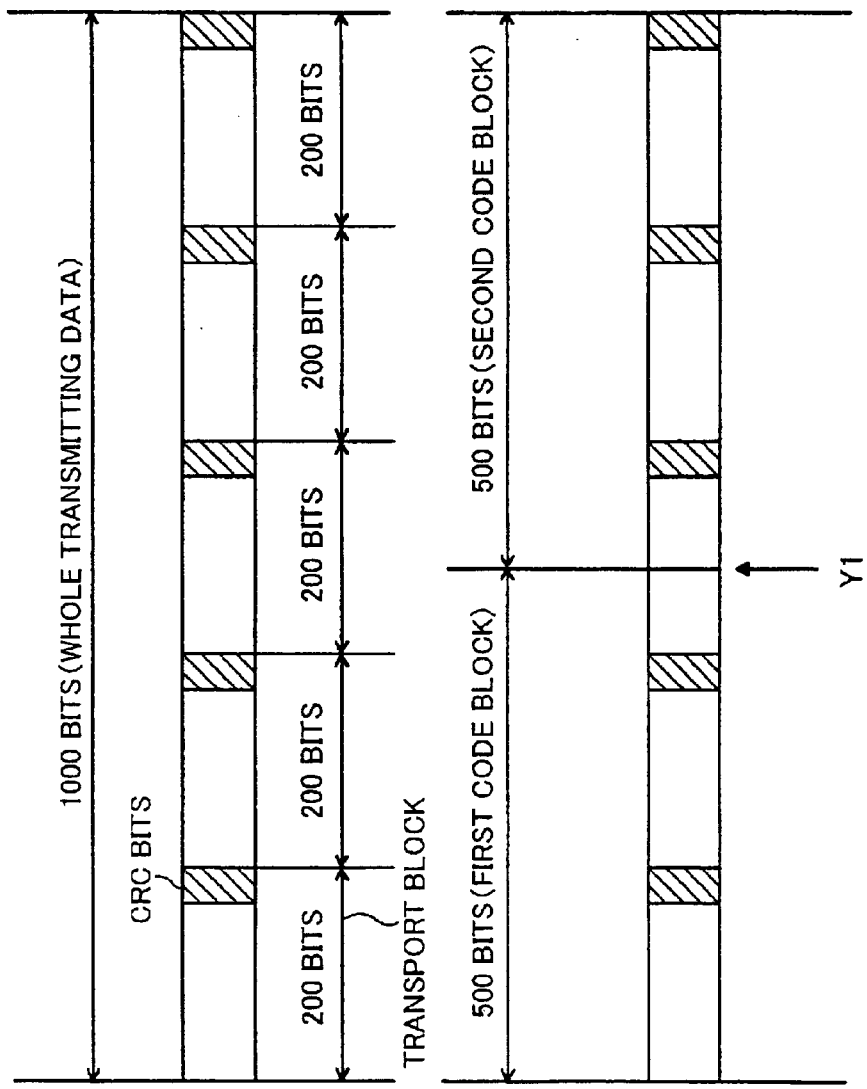
FIG. 5 illustrates a transport block, a code block, and CRC-bit.

Furthermore, as shown in FIG. 4, the code block segmentation processing section 304 is provided with a number of data detecting section 401, a data dividing/deleting position detecting section 402, and an access section 403.

In the above-described configuration, first, the error correcting decoding section 301 carries out error correcting decoding on the received signal that is encoded by error correcting coding processing at the coding apparatus 100 discussed above for every code block. The data (each code block) subjected to error correcting decoding is temporarily concatenated and stored in the first memory section 302 in a state of being concatenated. In the above example, error correcting decoding is performed on the first code block and the second code block each having 600 pieces of data.

Then, in the code block segmentation processing section 304, first, the number of data detecting section 401 detects the number of concatenated code blocks (2 pieces in the above-described example) stored in the first memory section 302. In other words, the number of data detecting section 401 detects the position of each concatenated code block. The number of code blocks is predetermined as described above, notified from a higher layer, or detected by a calculation method described in 3GPP TS 25.211.

The data dividing/deleting position detecting section 402 divides the concatenated code blocks (the first code block and the second code block in the above-described example) according to the detection result of the number of data detecting section 401 and detects the position of known data (the number of data is 200 pieces in the above-described example) inserted by the transmitting side and deletes the known data.

As a method of dividing into code blocks, it is possible to detect CRC-bit in data subjected to error correcting decoding during a division, and to divide the data after the error correcting decoding into code blocks so that the detected CRC-bit is placed at the end of code blocks.

The access section 403 writes to the second memory section 303 each code block obtained by carrying out the above-described division and deletion.

Then, the CRC bit inspecting section 305 carries out a CRC bit cyclic redundancy inspection of each code block stored in the second memory section 303. The data after the CRC bit inspection is written to the third memory section 306.

Thus, the decoding apparatus of this embodiment carries out error correcting decoding on every code block with CRC-bit placed at the end, and can thereby allow effective error correcting decoding and improve the reception performance.

In the case where known data is inserted in a code block, the error correcting decoding section 301 carries out a soft decision on the code block and carries out error correcting decoding, which provides more accurate error correcting decoding.

The reason for this is as follows. Since the part of the known data is known to both the transmitting side and the receiving side, the soft decision value of the known data part is temporarily stored in a memory and this stored soft decision value is replaced by a maximum value of the soft decision value that can be set in the memory when the known data is "0" and replaced by a minimum value of the soft decision value that can be set in the memory when the known data is "1". Then, if error correcting decoding on the known data part is performed using the replaced soft decision value, accurate error correcting decoding is performed because the data is known. In the case of soft decision decoding such as turbo decoding, if the position of known data inserted is the start position of a code block, the last-half data is decided using the decision result of the first-half data. The more accurate the decision result of the first-half data, the more accurate decision can be made. As a result, when originally necessary data in a code block is decoded, it is possible to perform more appropriate decoding.

Moreover, combining the coding apparatus 100 corresponding to Embodiment 1 and the decoding apparatus 300 corresponding to Embodiment 2 makes it possible to constitute a coding/decoding apparatus provided with both advantages of Embodiment 1 and Embodiment 2.

Furthermore, providing a mobile station apparatus with such a coding/decoding apparatus makes it possible to carry out effective coding/decoding on transmission/reception signals, improve the performance of the mobile station apparatus and provide the user with comfortable effects, for example, high quality voice.

Furthermore, providing a base station apparatus with such a coding/decoding apparatus makes it possible to carry out effective coding/decoding on transmission/reception signals and improve the performance of the base station apparatus.

As described above, the present invention carries out code block segmentation processing so that CRC-bit is placed at the end of each code block, and can thereby increase the performance of error correcting decoding and improve the communication quality.

This application is based on the Japanese Patent Application No.2000-126506 filed on Apr. 26, 2000, entire content of which is expressly incorporated by reference herein.

INDUSTRIAL APPLICABILITY

The present invention is applicable to a coding/decoding apparatus and coding/decoding method used for a-mobile station apparatus and base station apparatus, etc. in a digital mobile communication system.

What is claimed is:

1. A decoding apparatus comprising:
   an error correcting decoding unit that decodes on a code block basis a concatenated code block with each code block having CRC-bit placed at the end;
   a dividing unit that detects a position of concatenation of the concatenated code block with each code block decoded and performs division of the concatenated code block based on a detection result; and an inspecting unit that performs CRC-bit cyclic redundancy inspection on each divided code block provided by said division unit.

2. The decoding apparatus according to claim 1, wherein said dividing unit detects the position by detecting the CRC-bit in the concatenated code block with each code block decoded and performs the division by dividing the concatenated code block into a code block so that each detected CRC-bit is placed at the end of each divided code block.

3. The decoding apparatus according to claim 1, further comprising a deleting unit that deletes, when known data exists in a decoded code block, the known data.

4. The decoding apparatus according to claim 1, wherein said error correcting decoding unit replaces a soft decision value of the part of the known data of a code block with a maximum value of the soft decision value when the known data is 0 and replaces with a minimum value of the soft decision value when the known data is 1 and carries out error correcting decoding of the known data using the replaced soft decision value.

5. A mobile station apparatus comprising the decoding apparatus according to claim 1.

6. A base station apparatus comprising the decoding apparatus according to claim 1.

7. A decoding method comprising the steps of:

(a) performing error correcting decoding on a code block basis on a concatenated code block with each code block having a CRC-bit placed at the end thereof;

(b) detecting a position of concatenation of the concatenated code block with each code block decoded in step (a) and performing division of the concatenated code block based on a detection result; and (c) performing CRC bit cyclic redundancy inspection on each divided code block.

8. The decoding method according to claim 7, wherein said division includes detecting the CRC-bit in the concatenated code block with each code block decoded in step (a) and dividing the concatenated code block with each code block decoded in step (a) into a code block so that each detected CRC-bit is placed at the end of each divided code block.

9. The decoding method according to claim 7, further comprising the step of deleting, when known data exists in a code block decoded in step (a), the known data.

10. The decoding method according to claim 7, wherein step (a) includes replacing a soft decision value of the part of the known data of a code block with a maximum value of the soft decision value when the known data is 0 and replacing with a minimum value of the soft decision value when the known data is 1 and carrying out error correcting decoding of the known data using the replaced soft decision value.

11. A coding/decoding method comprising decoding a signal coded by a coding method comprising the steps of adding a CRC-bit to transport blocks by performing CRC coding on a transport block basis; concatenating the transport blocks with each transport block having the CRC-bit to provide a concatenated transport block; segmenting the concatenated transport block into code blocks based on a number of the transport blocks, such that the CRC-bit exists at the end of each segmented code block; and performing error correcting coding on each segmented code block by a decoding method according to claim 7.

* * * * *